United States Patent [19]

Ohkawa et al.

[11] Patent Number: 5,360,873
[45] Date of Patent: Nov. 1, 1994

[54] ACTINIC RADIATION-REACTIVE PRESSURE-SENSITIVE ADHESIVE COMPOSITION

[75] Inventors: Kazuo Ohkawa; Seiichi Saito, both of Tokyo, Japan

[73] Assignee: Asahi Denka Kogyo K.K., Tokyo, Japan

[21] Appl. No.: 110,078

[22] Filed: Aug. 20, 1993

Related U.S. Application Data

[63] Continuation of Ser. No. 632,190, Dec. 21, 1990, Pat. No. 5,278,199.

[30] Foreign Application Priority Data

Jan. 12, 1990 [JP] Japan ................................. 2-4936

[51] Int. Cl.$^5$ .................... C09J 133/08; C09J 133/10; C09J 181/02; C08F 2/48
[52] U.S. Cl. .................................. 525/193; 525/194; 525/350; 525/309; 525/313; 522/95; 522/121; 522/127; 522/180
[58] Field of Search ................. 522/90, 180, 121, 127, 522/95; 525/903, 193, 194, 350, 309, 313

[56] References Cited

U.S. PATENT DOCUMENTS

| | | | |
|---|---|---|---|
| 3,908,039 | 9/1975 | Guthrie et al. | 428/419 |
| 3,920,877 | 11/1975 | Barber et al. | 428/345 |
| 4,587,313 | 5/1986 | Ohta et al. | 522/180 |
| 4,818,621 | 4/1989 | Kuroda et al. | 522/121 |

FOREIGN PATENT DOCUMENTS

0001273  1/1985  Japan ................................. 522/180

*Primary Examiner*—Susan W. Berman
*Attorney, Agent, or Firm*—Flynn, Thiel, Boutell & Tanis

[57] ABSTRACT

An actinic radiation-reactive pressure-sensitive adhesive composition which can be cured in air at a high speed, without irritation and bad smell, comprises ① a pressure-sensitive adhesive compound comprising an acrylate copolymer and ② an actinic radiation-curable resin comprising (1) one or more polythiol compounds and (2) one or more polyene compounds each having an least two actinic radiation-reactive acrylate carbon-to-carbon double bonds in the molecule.

4 Claims, No Drawings

ACTINIC RADIATION-REACTIVE PRESSURE-SENSITIVE ADHESIVE COMPOSITION

This is a continuation of Ser. No. 07/632 190, filed Dec. 21, 1990 now U.S. Pat. No. 5,278,199 issued Jan. 11, 1994.

FIELD OF INDUSTRIAL APPLICATION

The present invention relates to a reactive pressure-sensitive adhesive composition. More particularly, it relates to an actinic radiation-reactive pressure-sensitive adhesive composition, the pressure-sensitive adhesiveness of which is lost or reduced by irradiation with an actinic radiation such as ultraviolet rays.

PRIOR ART

A semiconductor wafer of silicon or gallium arsenide is cut into chips having predetermined sizes in a dicing step and transferred to a mounting seem through several steps such as expanding. In this dicing step, a semiconductor wafer is cut in a state in which it is fixed on a pressure-sensitive adhesive sheet comprising a film of a plastic such as polyethylene, polypropylene or cross-linked polyolefin and a pressure-sensitive adhesive layer formed thereon, and in the mounting step, the chips are picked up, i.e., peeled off the sheet, and mounted. The pressure-sensitive adhesive to be used in the preparation of the above sheet is required to satisfy the requirements that a semiconductor wafer neither shifts nor is released in a dicing step and that the chips be easily picked up without leaving the adhesive thereon. Although a synthetic resin base pressure-sensitive adhesive comprising an acrylic or polyester synthetic resin and a crosslinking agent and a rubber base pressure-sensitive adhesive comprising a natural or synthetic rubber and a tackifier have been used as the pressure-sensitive adhesive for the pressure-sensitive adhesive sheet in the dicing step of a semiconductor wafer, these adhesives did not satisfy the above requirements. Therefore, there have been attempts to modify the pressure-sensitive adhesive tape itself, e.g. to impart a well-balanced pressure-sensitive adhesive force to the tape by applying a pressure-sensitive adhesive to only a limited area of the tape, or to facilitate the pickup of a diced semiconductor wafer by washing it in a state in which it is adhered to the tape with an organic solvent in the mounting step to lower the adhesive force.

However, modification of the tape has a detect that the obtained tape exhibits problematic performances such as poor adhesive force in the dicing step and is problematic in respect of the preparation process of the tape and the cost thereof, while the lowering of the adhesive force by the washing with an organic solvent necessitates the use of a lot of a chlorinated solvent such as trichloroethylene, which constitutes a social problem such as atmospheric pollution.

Recently, a process characterized by using a reactive pressure-sensitive adhesive containing a thermosetting or actinic radiation-curable resin and curing the resin by heating or irradiation with an actinic radiation after dicing to lower the pressure-sensitive adhesive force, thereby facilitating its pickup in the mounting step, has been noticed as means for solving the above problems.

Such a reactive pressure-sensitive adhesive has an advantage that it exhibits a low adhesive force in the mounting step, though it exhibits a sufficient adhesive force in the dicing step, which is a desirable performance for the adhesive to be used in the dicing of a semiconductor wafer, and another advantage in that no problem such as atmospheric pollution is caused because no organic solvent is used in the process.

More particularly, the reactive pressure-sensitive adhesive to be preferably used in the dicing of a semiconductor wafer is required to exhibit an adhesive force (90° peel strength at a peel rate of 50 mm/min) of 200 to 1000 g/20 mm for a semiconductor wafer before irradiation with an actinic radiation such as ultraviolet rays and that of 100 g/20 mm or below after curing. However, the performance of such a reactive pressure-sensitive adhesive widely varies depending upon the reactivity of the curable resin used.

When the reactive pressure-sensitive adhesive is heated or irradiated with an actinic radiation such as ultraviolet rays, the curable resin contained in the adhesive will fully react to attain a higher molecular weight, so that adhesiveness of the adhesive itself is lowered and releasability is imparted to the adhesive by virtue of the cure shrinkage caused therein, which brings about a lowering in the adhesive force thereof. However, when a curable resin having a low reactivity is used, the resin will not fully react, and thus fail in attaining a higher molecular weight and gives too small a cure shrinkage to satisfy the above requirements. Further, it is necessary from the standpoint of workability that the adhesive be cured to lose or lower its adhesive force for a time as short as possible.

For these reasons, the use of an actinic radiation-curable resin is superior to that of a thermosetting resin for preparing a reactive pressure-sensitive adhesive having excellent performance.

Examples of the actinic radiation-curable resin which is usable as the curable resin for a reactive pressure-sensitive adhesive include acrylate resins such as polyester acrylate, urethane acrylate, epoxy acrylate and polyether acrylate resins; unsaturatec polyester resins, epoxy resins, and polyene-thiol resins. With respect to the adhesive containing an acrylate resin, for example, there have been proposed an adhesive containing a polyester acrylate as the actinic radiation-curable resin which is suitable for the pressure-sensitive adhesive sheet disclosed in Japanese Patent Laid-Open Nos. 196956/1985 and 223139/1985 and an adhesive containing a urethane acrylate resin as the actinic radiation-curable resin which is suitable for the pressure-sensitive adhesive sheen disclosed in Japanese Patent Laid-Open Nos. 205179/1987 and 205180/1987. However, these adhesives characterized by containing an acrylate resin as the actinic radiation-curable resin cannot exhibit sufficient performance in air because the cure thereof is inhibited by oxygen, so that the dicing of a semiconductor wafer must be conducted in, for example, an inert gas such as nitrogen or a vacuum. Under these circumstances, the development of an actinic radiation-reactive pressure-sensitive adhesive composition which can be cured at a high rate, even in air without suffering from cure inhibition by oxygen has been sought.

Further, when a polyfunctional monomer or diluent is added to an acrylate resin to improve the reactivity of the resin in the air, the resulting composition has another problem of being highly irritating to the skin and very smelly.

SUMMARY OF THE INVENTION

The inventors of the present invention have studied to obtain an actinic radiation-reactive pressure-sensitive adhesive composition which can satisfy the various characteristics necessary for the pressure-sensitive adhesive to be used in a pressure-sensitive adhesive sheet for fixing a semiconductor wafer in the dicing thereof and have found that an actinic radiation-reactive pressure-sensitive adhesive composition which can be cured at a high rate, even in air, without suffering from cure inhibition by oxygen, exhibits an adhesive force (90° peel strength at a peel rate: 50 mm/min) of 200 to 1000 g/20 mm for a semiconductor wafer before curing and that of 100 g/20 mm or below after curing and has low irritation to the skin can be obtained by using an actinic radiation-curable resin comprising one or more polythiol compounds and one or more polyene compounds having at least two actinic radiation-reactive carbon-to-carbon double bonds in the molecule. The present invention has been accomplished on the basis of this finding.

The actinic radiation-reactive pressure-sensitive adhesive composition of the present invention is characterized by comprising as the essential components:

① a pressure-sensitive adhesive organic compound, and

② an actinic radiation-curable resin comprising (1) one or more polythiol compounds and (2) one or more polyene compounds each having at least two actinic radiation-reactive carbon-to-carbon double bonds in the molecule.

The pressure-sensitive adhesive organic compound to be used as a constituent in the present invention may be any conventional one and examples thereof include natural rubber, isoprene rubber, styrene-butadiene rubber, styrene-butadiene block copolymer, butyl rubber, polyisobutylene, silicone rubber, polyvinyl isobutyl ether, chloroprene rubber, nitrile rubber, graft rubber, reclaimed rubber, saturated copolyester resin, acrylate polymer, and acrylate copolymer, among which saturated copolyester resin and acrylate copolymer are particularly preferable.

The saturated copolyester resin is one prepared by the esterification of one or more saturated polycarboxylic acids with one or more saturated polyhydric alcohols and having a relatively low glass transition temperature. Examples of the saturated polycarboxylic acid include terephthalic, isophthalmic, phthalic, 2,6-naphthalenedicarboxylic, diphenyldicarboxylic, succinic, adipic, azelaic, sebacic, dodecanedionic and 1,4-cyclohexanedicarboxylic acids and trimellitic anhydride. Examples of the saturated polyhydric alcohol include ethylene glycol, diethylene glycol, triethylene glycol, polyethylene glycol, propylene glycol, dipropylene glycol, polypropylene glycol, 1,3-butanediol, 1,4-butanediol, 1,6-hexanediol, neopentyl glycol, bisphenol A, hydrogenated bisphenol A, bisphenol A-ethylene oxide adduct, bisphenol A-propylene oxide adduct, thiodiethanol, trimethylolpropane, glycerol, triethanolamine, pentaerythritol, dipentaerythritol, sorbitol, hydroquinone, pyrogallol, xylylene glycol, 4,4'-dihydroxydiphenylmethane, trishydroxyethyi isocyanurate and bishydroxyethylhydantoin ethylene glycol and adducts thereof with alkylene oxide such as ethylene oxide or propylene oxide. Among the saturated copolyester resins described above, saturated copolyester resins prepared by the esterification of one or more saturated dicarboxylic acids with one or more saturated dihydric alconois are preferable. Particularly, a saturated copolyester resin prepared by the esterification of saturated dicarboxylic acids with saturated dihydric alcohols at a molar ratio between 80:20 and 20:80 is still preferably used as the pressure-sensitive adhesive organic compound constituting the actinic radiation-reactive pressure-sensitive adhesive composition according to the present invention.

The saturated copolyester resin to be used in the present invention may contain a crosslinking agent to control the adhesive force of the adhesive composition and examples of the crosslinking agent include melamine, isocyanate, acid anhydride, amine, epoxy resin and phenolic resin.

The acrylate copolymer to be used in the present invention is an acrylic resin prepared by the addition polymerization of two or more acrylic monomers and particularly, an acrylic resin comprising a soft main monomer having a low glass transition point for imparting pressure-sensitive adhesiveness to the copolymer, a hard comonomer having a high glass transition point in a low content for imparting adhesiveness and cohesive force to the copolymer and a functional monomer for improving the crosslinkability and adhesiveness of the copolymer is preferable. Preferred examples of the main monomer of the acrylate copolymer include ethyl acrylate, butyl acrylate and 2-ethylhexyl acrylate, those of the comonomer include vinyl acetate, acrylonitrile, acrylamide, styrene, methyl methacrylate, and methyl acrylate; and those of the functional monomer include methacrylic, acrylic and itaconic acids; hydroxyethyl methacrylate, hydroxypropyl methacrylate, dimethylaminoethyl methacrylate, methylolacrylamide, glycidyl methacrylate and maleic anhydride. Among the acrylate copolymers described above, an acrylate copolymer having a weight ratio of the main monomer to the comonomer of between 90:10 and 10:90 and containing a functional monomer in an amount of 0.1 to 10 parts by weight per 100 parts by weight of the sum total of the main monomer and the comonomer is particularly preferably used as the adhesive organic compound constituting the actinic radiation-reactive pressure-sensitive adhesive composition of the present invention.

The acrylate copolymer may contain a crosslinking agent to control the pressure-sensitive adhesive force and examples thereof include melamine, isocyanate, acid anhydride, amine, epoxy resin and phenolic resin.

The actinic radiation-curable resin to be used as the other constituent in the present invention comprises one or more polythiol compounds and one or more polyene compounds, each having at least two actinic radiation-reactive carbon-to-carbon double bonds in the molecule.

The polythiol compound to be used as a constituent of the actinic radiation-curable resin according to the present invention is one represented by the general formula (1):

wherein A is an organic residue having a valence of q and no unsaturated bond reactive with a SH group, and q is an integer of 2 or above, having a molecular weight of 80 to 10000 and exhibiting a viscosity of nearly 0 to 10000 P at 50° C. Preferred examples of the polythiol compound include polythiols prepared by the esterification of a polyhydric alcohol with thioglycolic, α-mercaptopropionic or β-mercaptopropionic acid; aliphatic or aromatic polythiols such as ethanedithiol, propanedithiol, hexamethylenedithiol and xylylenedithiol; polythiols prepared by replacing the halogen atoms of an adduct of an alcohol with epihalohydrin by mercapto groups; and reaction products between polyepoxy compounds and hydrogen sulfide. Examples of the polyhydric alcohol to be used in the above esterification of thioglycolic or mercaptopropionic acid include ethylene glycol, diethylene glycol, triethylene glycol, polyethylene glycol, propylene glycol, dipropylene glycol, polypropylene glycol, 1,3-butanediol, 1,4-butanediol, 1,6-hexanediol, neopentyl glycol, bisphenol A, hydrogenated bisphenol A, bisphenol A-ethylene oxide adduct, bisphenol A-propylene oxide adduct, thiodiethanol, trimethylolpropane, glycerol, triethanolamine, pentaerythritol, dipentaerythritol, sorbitol, hydroquinone, pyrogallol, xylylene glycol, 4,4'-dihydroxydiphenylmethane, trishydroxyethyl isocyanurate and bishydroxyethylhydantoin.

These polythiol compounds may be used alone or as a mixture of two or more of them.

The polyene compound to be used as the other constituent of the actinic radiation-curable resin is preferably an organic compound having actinic radiation-reactive carbon-to-carbon double bonds in the molecule and examples thereof include polybutadiene, polyisoprene, alkyl ether resin, allyl ester resin, allyl urethane resin, acrylate resin, methacrylate resin, vinyl ether resin, vinyl thioether resin, N-vinyl compound, unsaturated polyester resin, and vinylcycloacetal resin. Particularly, polyene compounds each having at least two actinic radiation-reactive carbon-to-carbon double bonds in the molecule and derived from a substituted or unsubstituted allyl alcohol, triallyl cyanurate and triallyl isocyanurate are still preferably used as the polyene compound constituting the actinic radiation-curable resin according to the present invention.

The polyene compound having at least two actinic radiation-reactive carbon-to-carbon double bonds in the molecule and derived from a substituted or unsubstituted allyl alcohol is preferably a polyene compound derived from an adduct of a substituted or unsubstituted allyl alcohol with an epoxy-containing organic compound, and represented by one of the following general formulas (2) to (5):

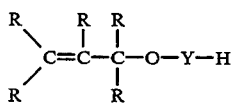 (2)

wherein R is a hydrogen atom or a group selected from among a phenyl group and alkyl groups each having 1 to 10 carbon atoms, wherein a plurality of R groups may be the same or different from each other; and Y is a group comprising units formed by the ring opening of one or more epoxy compounds selected from the group consisting of ethylene oxide, propylene oxide, butylene oxide, styrene oxide, cyclohexene oxide, epihalohydrin and allyl glycidyl ether through the cleavage of the carbon-to-oxygen bond, which are arranged alone, in block or at random, with the proviso that at least one unit formed by the ring opening of allyl glycidyl ether through the cleavage of the carbon-to-oxygen bond of the epoxy group is contained in Y,

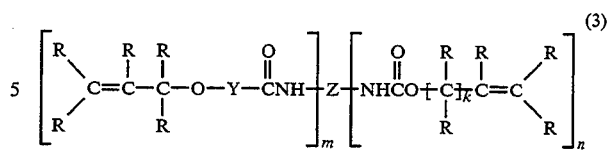 (3)

wherein R is a hydrogen atom or a group selected from among a phenyl group and alkyl groups each having 1 to 10 carbon atoms, wherein a plurality of R groups may be the same or different from each other; and Y is a group comprising units formed by the ring opening of one or more epoxy compounds selected from the group consisting of ethylene oxide, propylene oxide, butylene oxide, styrene oxide, cyclohexene oxide, epihalohydrin and allyl glycidyl ether through the cleavage of the carbon-to-oxygen bond, which are arranged alone, in block or at random; Z is a group selected from the group consisting of residues of isocyanate-terminated monomers each having 1 or 2 aromatic nuclei and a valence of (m+n), residues of isocyanate-terminated monomers each having 1 or 2 alicyclic nuclei and a valence of (m+n), residues of isocyanate-terminated aliphatic monomers each having a valence of (m+n), trimers of the isocyanate-terminated monomers described above, residues of isocyanate-terminated prepolymers prepared from hydroxyl-terminated saturated polyester polyol and the isocyanate-terminated monomer described above, residues of isocyanate-terminated prepolymers prepared from hydroxyl-terminated saturated polyether polyol and the isocyanate-terminated monomers described above and residues of isocyanate-terminated compounds prepared from the isocyanate-terminated monomers described above and polyhydric alcohols; k is an integer of 1 to 10, m is an integer of 1 to 6, and n is an integer of 0 to 5, with the proviso that the sum total of m and n is an integer of 2 or above,

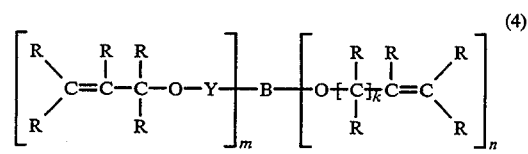 (4)

wherein R is a hydrogen atom or a group selected from among a phenyl group and alkyl groups each having 1 to 10 carbon atoms, wherein a plurality of R groups may be the same or different from each other; and Y is a group comprising units formed by the ring opening of one or more epoxy compounds selected from the group consisting of ethylene oxide, propylene oxide, butylene oxide, styrene oxide, cyclohexene oxide, epihalohydrin and allyl glycidyl ether through the cleavage of the carbon-to-oxygen bond, which are arranged alone, in block or at random; B is a group selected from the group consisting of residues of saturated or unsaturated aliphatic carboxylic acids each having 4 to 10 carbon atoms and a valence of (m+n) which are bonded to other groups through ester linkages, residues of carboxylic acids each having one aromatic nucleus and a valence of (m+n) which are bonded to other groups through ester linkages, and residues of carboxylic acids each having one alicyclic nucleus and a valence of (m+n) which are bonded to other groups through ester linkages; k is an integer of 1 to 10, m is an integer of 1 to 6, and n is an integer of 0 to 5, with the proviso that the sum total of (m+n) is an integer of 2 or above,

 (5)

wherein R' is a hydrogen atom, an l-valent organic residue having 1 to 30 carbon atoms and not containing any olefinic double bond, which may contain an oxygen, nitrogen, sulfur, silicon or halogen atom or a residue prepared by removing hydroxyl groups from a saturated polyester polyol having a molecular weight of 100 to 10000; Y is a group comprising units formed by the ring opening of one or more epoxy compounds selected from the group consisting of ethylene oxide, propylene oxide, butylene oxide, styrene oxide, cyclohexene oxide, epihalohydrin, and allyl glycidyl ether through the cleavage of the carbon-to-oxygen bond, which are arranged alone, in block or at random, with the proviso that at least two units formed by the ring opening of allyl glycidyl ether through the cleavage of the carbon-to-oxygen bond of the epoxy group are present; and Z is an integer of 1 to 6.

The polyene compound represented by the above general formula (2) is prepared by the addition of an epoxy-containing organic compound (containing at least one allyl glycidyl ether molecule) to a substituted or unsubstituted allyl alcohol.

The addition of an epoxy-containing compound to a substituted or unsubstituted allyl alcohol can be conducted by various known processes. For examples, it can be easily conducted by incorporating a catalyst (such as BF$_3$-ether complex) in an allyl alcohol and dropping allyl glycidyl ether into the obtained mixture at an elevated temperature (about 60° C.) to complete a reaction.

Examples of the substituted or unsubstituted allyl alcohol to be used in the above addition include allyl alcohol, crotyl alcohol, 1-hydroxypentene-2, 1-hydroxyhexene-2, 1-hydroxyheptene-2, 1-hydroxynonene-2, 1-hydroxydecene-2, 3-hydroxybutene-1, 3-hydroxypentene-2, 2-hydroxyhexene-3, 3-hydroxy-2,3-dimethylbutene-1, 4-hydroxy-2,3,4-trimethylpentene-2, and 2-hydroxy-2,3,4,5-tetramethylhexene-3.

The epoxy-containing organic compound to be used in the above addition includes ethylene oxide, propylene oxide, butylene oxide, allyl glycidyl ether, cyclohexene oxide, styrene oxide, and epihalohydrin. These epoxy-containing organic compounds may be added alone or two or more of them may be added at random or in block, with the proviso that at least one allyl glycidyl ether unit is present in the obtained adduct.

Examples of the polyene compound represented by the general formula (2) include adducts of allyl alcohols with allyl glycidyl ether, adducts of allyl alcohols with allyl glycidyl ether and epichlorohydrin, adducts of allyl alcohols with allyl glycidyl ether and ethylene oxide, and adducts of allyl alcohols with allyl glycidyl ether, epichlorohydrin and ethylene oxide.

The viscosity of the polyene compound represented by the general formula (2) at 50° C. is generally nearly 0 to 10000 P, preferably 1 to 1000 P.

The polyene compound represented by the above general formula (3) can be prepared by adding an epoxy-containing organic compound to a substituted or unsubstituted allyl alcohol and reacting the obtained adduct with a polyisocyanate compound.

The addition of an epoxy-containing compound to a substituted or unsubstituted allyl alcohol can be conducted by various known processes. For examples, it can be easily conducted by incorporating a catalyst (such as BF$_3$ ether complex) in an allyl alcohol and dropping allyl glycidyl ether into the obtained mixture at an elevated temperature (about 60° C.) to complete the reaction. Alternatively, some of such adducts are commercially available (for example, an adduct of allyl alcohol with 1 to 4 ethylene oxide units is commercially available under the trade name of "Allyl glycol" (a product of Nippon Nyukazai Co., Ltd.).

Examples of the substituted or unsubstituted allyl alcohol to be used in the above addition include allyl alcohol, crotyl alcohol, 1-hydroxypentene-2, 1-hydroxyhexene-2, 1-hydroxyheptene-2, 1-hydroxynonene-2, 1-hydroxydecene-2, 3-hydroxybutene-1, 3-hydroxypentene-2, 2-hydroxyhexene-3, 3-hydroxy-2,3-dimethylbutene-1, 4-hydroxy-2,3,4-trimethylpentene-2, and 2-hydroxy-2,3,4,5-tetramethylhexene-3.

The epoxy-containing organic compound to be used in the above addition includes ethylene oxide, propylene oxide, butylene oxide, allyl glycidyl ether, cyclohexene oxide, styrene oxide and epihalohydrin. These epoxy-containing organic compounds may be added alone or two or more of them may be added at random or in block. Preferable examples of the adduct include adducts of allyl alcohols with allyl glycidyl ether, adducts of allyl alcohols with allyl glycidyl ether and epichlorohydrin, adducts of allyl alcohols with allyl glycidyl ether and ethylene oxide, and adducts of allyl alcohols with allyl glycidyl ether, epichlorohydrin and ethylene oxide.

A preferred polyene compound represented by the above general formula (3) can be prepared by reacting the adduct of a substituted or unsubstituted allyl alcohol with an epoxy-containing organic compound thus prepared with a polyisocyanate compound. To illustrate the preparation of the polyene compound more particularly, the polyene compound can be prepared by feeding a commercially available adduct of allyl alcohol with ethylene oxide (Allyl glycol, a product of Nippon Nyukazai Co., Ltd.) and Hylene W (dicyclohexylmethane 4,4'-diisocyanate; a product of Du Pont) in such amounts that the equivalent of the hydroxyl group is equal to that of the isocyanate group and carrying out a reaction according to a conventional process for the preparation of a urethane.

The polyisocyanate compound include not only Hylene W but also monomeric polyisocyanates such as tolylene diisocyanate, diphenylmethane 4,4'-diisocyanate, xylylene diisocyanate, isophorone diisocyanate and hexamethylene diisocyanate; trimers of tolylene diisocyanate or isophorone diisocyanate; isocyanate-terminated prepolymers prepared from hydroxy-terminated compounds such as saturated polyester polyol or polyether polyol and the above monomeric polyisocyanate compounds; and isocyanate-terminated compounds prepared from the above monomeric polyisocyanate compounds and the polyhydric alcohols mentioned above with respect to the polythiol compound (1). The above polyester polyol can be prepared by the esterification of a polyhydric alcohol as described above with a polycarboxylic acid such as succinic, adipic, sebacic, phthalic, hexahydrophthalic, trimellitic or pyromellitic acid. The polyether polyol includes polyethylene glycol, polypropylene glycol, polybutylene glycol, polytetramethylene glycol, and adducts of the above polyhydric alcohols with alkylene oxides, which have each a molecular weight of 100 to 10000.

The polyene compound represented by the general formula (3) also includes those prepared by the following process. Namely, an adduct of a substituted or unsubstituted allyl alcohol, with an epoxy-containing compound is reacted with a polyisocyanate compound in such a way that part of the isocyanate groups remain in an unreacted state and the remaining isocyanate groups are then reacted with an unsaturated alcohol, with the proviso that this sequence of reaction is conducted in such a way that at least one unit of the above adduct is contained in each molecule. To illustrate the process more particularly, Allyl glycol, which has been described above, is reacted with Hyiene W at an equivalent ratio of between 1.0:2.0 and 1.9:2.0 (in a state wherein the isocyanate group is excessive) to give a partially capped isocyanate. Then, the remaining isocyanate groups are reacted with allyl alcohol to give an objective polyene compound. Examples of the unsaturated alcohol include not only allyl alcohol but also crotyl alcohol, 3-hydroxybutene-1, 4-hydroxy-pentene-2, 2-hydroxyhexene-3, 2-hydroxyheptene-3, 2-hydroxyoctene-3, 2,3-dimethyl-1-hydroxybutene-2, 2,3-dimethyl-3-hydroxypentene-2, 4-hydroxybutene-1, 5-hydroxypentene-1, 6-hydroxyhexene-1, 7-hydroxy-heptene-1 and 8-hydroxyoctene-1.

The viscosity of the polyene compound represented by the general formula (3) at 50° C. is generally nearly 0 to 10000 P, preferably 1 to 1000 P.

The polyene compound represented by the above general formula (4) is prepared by adding an epoxy-containing organic compound to a substituted or unsubstituted allyl alcohol and reacting the obtained adduct with an acid anhydride or a polybasic acid.

The addition of an epoxy-containing compound to a substituted or unsubstituted allyl alcohol can be conducted by various known processes. For examples, it can be easily conducted by incorporating a catalyst (such as $BF_3$ ether complex) in an allyl alcohol and dropping allyl glycidyl ether into the obtained mixture at an elevated temperature (about 60° C.) to complete a reaction. Alternatively, some of such adducts are commercially available (for example, an adduct of allyl alcohol with 1 to 4 ethylene oxide units is commercially available under the trade name of "Allyl glycol" (a product of Nippon Nyukazai Ltd.)).

Examples of the substituted or unsubstituted allyl alcohol to be used in the above addition include allyl alcohol, crotyl alcohol, 1-hydroxypentene-2, 1-hydroxyhexene-2, 1-hydroxyheptene-2, 1-hydroxynonene-2, 1-hydroxydecene-2, 3-hydroxybutene-1, 3-hydroxypentene-2, 2-hydroxyhexene-3, 3-hydroxy-2,3-dimethylbutene-1, 4-hydroxy-2,3,4-trimethylpentene-2, and 2-hydroxy-2,3,4,5-tetramethylhexene-3.

The epoxy-containing organic compound to be used in the above addition includes ethylene oxide, propylene oxide, butylene oxide, allyl glycidyl ether, cyclohexane oxide, styrene oxide and epihalohydrin. These epoxy-containing organic compounds may be added alone or two or more of them may be added at rantom or in block. Preferable examples of the adduct include adducts of allyl alcohols with allyl glycidyl ether, adducts of allyl alcohols with allyl glycidyl ether and epichlorohydrin, adducts of allyl alcohols with allyl glycidyl ether and ethylene oxide and adducts of allyl alcohols with allyl glycidyl ether, epichloro-hydrin and ethylene oxide.

A preferable polyene compound represented by the above general formula (4) can be prepared by reacting the adduct of a substituted or unsubstituted allyl alcohol with an epoxy-containing organic compound thus prepared with an acid anhydride or a polybasic acid. More particularly, it can be prepared by the esterification of a commercially available adduct of allyl alcohol with ethylene oxide ("Allyl glycol"; a product of Nippon Nyukazai Co., Ltd.) with phthalic anhydride according to a conventional esterification process.

Examples of the acid anhydride or polybasic acid to be used in the preparation of the polyene compound represented by the general formula (4) include maleic, succinic and hexahydrophthalic anhydrides and adipic, succinic, sebacic, phthalic, terephthalic, isophthalic, maleic, fumaric and iraconic acids.

The polyene compound represented by the general formula (4) also includes compounds prepared by the following process. Namely, an adduct of a substituted or unsubstituted allyl alcohol with an epoxy-containing organic compound is reacted an acid anhydride or polybasic acid as described above in such a way that part of the carboxylic acid remains in an unreacted state and the remaining carboxylic acid is then reacted with an unsaturated alcohol, with the proviso that this sequence of reactions is conducted in such a way that at least one unit of the above adduct is present in each molecule. To illustrate the process more particularly, Allyl glycol which has been described above is reacted with phthalic anhydride at an equivalent ratio of between 1.0:2.0 and 1.9:2.0 (in a state wherein acid anhydride is excessive) to give a partial ester and the remaining carboxyl groups are then reacted with allyl alcohol to give an objective polyene compound. The unsaturated alcohol includes not only allyl alcohol but also crotyl alcohol, 3-hydroxybutene-1, 4-hydroxypentene-2, 2-hydroxyhexene-3, 2-hydroxyheptene-3, 2-hydroxyoctene-3, 2,3-dimethyl-1-hydroxybutene-2, 2,3-dimethyl-3-hydroxypentene-2, 4-hydroxybutene-1, 5-hydroxypentene-1, 6-hydroxyheptene-1, 7-hydroxyheptene-1 and 8-hydroxyoctene-1.

The viscosity of the polyene compound represented by the general formula (4) at 50° C. is generally nearly 0 to 10000 P, preferably 1 to 1000 P.

The polyene compound represented by the general formula (5) is an adduct of a mono- or poly-hydric alcohol or a saturated polyester polyol with allyl glycidyl ether containing at least two allyl glycidyl ether units per molecule on an average. Further adducts of a mono- or poly-hydric alcohol or a saturated polyester polyol with allyl glycidyl ether and one or more other three-membered ring epoxy compounds can be preferably used. To illustrate the preparation of the polyene compound represented by the general formula (5) more particularly, the compound can be easily prepared by incorporating $BF_3$-ether complex as a catalyst in methanol and dropping allyl glycidyl ether into the obtained mixture at 60° C. to complete the reaction. The monohydric alcohol to be preferably used is an aliphatic, alicyclic, aromatic or O, N, S or halogen-containing alcohol having 1 to 15 carbon atoms and examples thereof include methanol, ethanol, propanol, butanol, amyl alcohol, hexyl alcohol, octanol, 2-ethylhexanol, decanol, cyclohexanol, methoxyethanol, methylthioethanol, N,N-dimethylethanol, phenol, 2,6-dimethylphenol, and ethylene chlorohydrin. The polyhydric alcohol include aliphatic, alcyclic, aromatic or O, N, or S-containing di- to hexa-hydric alcohols each having 2 to 30 carbon atoms mentioned above with respect to the polythiol compound (1). The saturated polyester polyol includes those each having a molecular weight of 100 to 10000 and prepared by the esterification of a polyhydric alcohol as described above with a carboxylic acid such as succinic, adipic, sebacic phthalic, hexahydrophthalic, trimellitic or pyromellitic acid according to a conventional esterification process.

The three-membered ring epoxy compound to be arbitrarily used includes ethylene oxide, propylene oxide, butylene oxide, cyclohexene oxide, styrene oxide, and epihalohydrin, which may be used alone, as a mixture of two or more of them, or together with allyl glycidyl ether.

The addition of the three-membered ring epoxy compound to water or the like is conducted by the use of an acid catalyst such as sulfuric acid, BF$_3$-ether complex or tin tetrachloride or a base catalyst such as NaOH, KOH or triethylamine according to a conventional process.

The viscosity of the polyene compound represented by the general formula (5) at 50° C. is generally nearly 0 to 10000 P, preferably 1 to 1000 P.

Triallyl cyanurate and triallyl isocyanurate each exhibit a viscosity of as low as 200 cP or below at 25° C. and are excellent in reactivity upon irradiation with an actinic radiation such as ultraviolet rays by virtue of the presence of three actinic radiation-reactive carbon-to-carbon double bonds therein, so that they can be used as a reactive diluent for the actinic radiation-reactive pressure-sensitive adhesive composition of the present invention.

These polyene compounds may be used either alone or as a mixture of two or more of them.

Further, an acrylate resin having at least two actinic radiation-reactive carbon-to-carbon double bonds in the molecule is also particularly preferably used as the polyene compound constituting the actinic radiation-curable resin according to the present invention.

The acrylate resin includes epoxy acrylate, urethane acrylate, polyester acrylate, polyether acrylate, and esters of alcohols with acrylic acid.

The epoxy acrylate is preferably one prepared by the reaction of a known aromatic, alicyclic or aliphatic epoxy resin with acrylic acid, particularly preferably an acrylate of an aromatic epoxy resin prepared by the reaction between acrylic acid and a polyglycidyl ether of a polyhydric phenol having at least one aromatic nucleus or an adduct thereof with alkylene oxide. Particular examples thereof include acrylates prepared by reacting a glycidyl ether prepared by the reaction between bisphenol A or an adduct thereof with alkylene oxide and epihalohydrin with acrylic acid; and acrylates prepared by the reaction between epoxy novolak resins and acrylic acid.

Preferable examples of the urethane acrylate include acrylates prepared by reacting one or two hydroxy-containing polyesters or polyethers with hydroxy-containing acrylates and isocyanates; and acrylates prepared by the reaction of hydroxy-containing acrylates with isocyanates.

The hydroxy-containing polyester to be used in the preparation of the urethane acrylate is preferably one prepared by the esterification of one or more polyhydric alcohols or adducts thereof with alkylene oxide with one or more polybasic acids. Examples the polyhydric alcohol include 1,3-butanediol, 1,4-butanediol, 1,6-hexanediol, ethylene glycol, diethylene glycol, triethylene glycol, neopentyl glycol, polyethylene glycol, polypropylene glycol, trimethylolpropane, pentaerythritol, dipentaerythritol, bisphenol A, hydrogenated bisphenol A, thiodiethanol, glycerin, triethanolamine, sorbitol, hydroquinone, pyrogallol, xylene glycol, 4,4'-dihydroxydiphenylmethane, trishydroxyethyl isocyanurate and bishydroxyethylhydantoin. Examples of the polybasic acid include succinic, adipic, sebacic, phthalic, hexahydrophthalic, trimellitic and pyromellitic acids.

The hydroxy-containing polyether to be used therein is preferably one prepared by the addition of one or more alkylene oxides to a polyhydric alcohol. Examples of the polyhydric alcohol include 1,3-butanediol, 1,4-butanediol, 1,6-hexanediol, ethylene glycol, diethylene glycol, triethylene glycol, neopentyl glycol, polyethylene glycol, polypropylene glycol, trimethylolpropane, pentaerythritol, dipentaerythritol, bisphenol A, hydrogenated bisphenol A, thiodiethanol, glycerin, triethanolamine, sorbitol, hydroquinone, pyrogallol, xylene glycol, 4,4'-dihydroxydiphenylmethane, trishydroxyethyl isocyanurate, and bishydroxyethylhydantoin. The alkylene oxide includes ethylene oxide and propylene oxide.

The hydroxy-containing acrylate is preferably one prepared by the esterification between a polyhydric alcohol and acrylic acid. Examples of the polyhydric alcohol include 1,3-butanediol, 1,4-butanediol, 1-6-hexanediol, ethylene glycol, diethylene glycol, triethylene glycol, neopentyl glycol, polyethylene glycol, polypropylene glycol, trimethylolpropane, pentaerythritol, dipentaerythritol, bisphenol A, hydrogenated bisphenol A, thiodiethanol, glycerin, triethanolamine, sorbitol, hydroquinone, pyrogallol, xylene glycol, 4,4'-dihydroxydiphenylmethane, trishydroxyethyl isocyanurate, and bishydroxyethylhydantoin. Among these hydroxy-containing acrylates, those prepared by the esterification of aliphatic polyhydric alcohols with acrylic acid are particularly preferable and examples thereof include 2-hydroxyethyl acrylate and pentaerythritol triacrylate.

Examples of the isocyanate include monomeric polyisocyanates such as dicyclohexylmethane 4,4'-diisocyanate, tolylene diisocyanate, diphenylmethane 4,4'-diisocyanate, xylylene diisocyanate, isophorone diisocyanate, and hexamethylene diisocyanate; and trimers of tolylene diisocyanate and isophorone diisocyanate.

The polyester acrylate is preferably one prepared by reacting a hydroxy-containing polyester with acrylic acid.

The hydroxyl-containing polyester to be used in the preparation of the polyester acrylate is preferably one prepared by the esterification of one or more polyhydric alcohols with one or more members selected from among monobasic acids, polybasic acids and phenols and examples of the polyhydric alcohol included 1,3-butanediol, 1,4-butanediol, 1,6-hexanediol, ethylene glycol, diethylene glycol, triethylene glycol, neopentyl glycol, polyethylene glycol, polypropylene glycol, trimethylolpropane, pentaerythritol, dipentaerythritol, bisphenol A, hydrogenated bisphenol A, thiodiethanol, glycerin, triethanolamine, sorbitol, hydroquinone, pyrogallol, xylene glycol, 4,4'-dihydroxydiphenylmethane, trishydroxyethyl isocyanurate, and bishydroxyethylhydantoin. Examples of the monobasic acid include formic, acetic, butylcarboxylic and benzoic acids. Examples of the polybasic acid include succinic, adipic, sebacic, phthalic, hexahydrophthalic, trimellitic and pyromeltitic acids. The phenol includes phenol and p-nonylphenyol.

The polyether acrylate is preferably one prepared by reacting a hydroxyl-containing polyether with acrylic acid.

The hydroxyl-containing polyether to be used in the preparation of the polyether acrylate is preferably one prepared by the addition of one or more alkylene oxides to a polyhydric alcohol. Examples on the polyhydric alcohol include 1,3-butanediol, 1,4-butanediol, 1,6-hexanediol, ethylene glycol, diethylene glycol, triethylene glycol, neopentyl glycol, polyethylene glycol, polypropylene glycol, trimethylolpropane, pentaerythritol, dipentaerythritol, bisphenol A, hydrogenated bisphenol A, thiodiethanol, glycerin, triethanolamine, sorbitol, hydroquinone, pyrogallol, xylene glycol, 4,4'-dihydroxydiphenylmethane, trishydroxyethyl isocyanurate, and bishydroxyethylhydantoin. Examples of the alkylene oxide include ethylene oxide and propylene oxide.

The acrylate of alcohol is preferably one prepared by reacting acrylic acid with an aromatic or aliphatic alcohol having at least one hydroxyl group in the molecule or an adduct thereof with an alkylene oxide. Examples thereof include 2-ethylhexyl acrylate, 2-hydroxyethyl acrylate, 2-hydroxypropyl acrylate, isoamyl acrylate, lauryl acrylate, stearyl acrylate, isooctyl acrylate, tetrahydrofurfuryl acrylate, isobornyl acrylate, benzyl acrylate, 1,3-butanediol diacrylate, 1,4-butanediol diacrylate, 1,6-hexanediol diacrylate, diethylene glycol diacrylate, triethylene glycol diacrylate, neopentyl glycol diacrylate, polyethylene glycol diacrylate, polypropylene glycol diacrylate, trimethylolpropane triacrylate, pentaerythritol triacrylate, and dipentaerythritol hexaacrylate.

The viscosity of the acrylate resin described above at 50° C. is generally nearly 0 to 10000 P, preferably 1 to 1000 P.

The curing of the acrylate resin is inhibited by oxygen in the air, so that a low-molecular-weight acrylate monomer such as styrene is generally added to the resin in order to improve the curing rate, though such a low-molecular-weight acrylate monomer is generally highly irritating to the skin.

The actinic radiation-reactive pressure-sensitive adhesive composition of the present invention is characterized in that the actinic radiation-curable resin is constituted of a polyene compound having at least two actinic radiation-reactive carbon-to-carbon double bonds in the molecule, such as acrylate resins, and a polythiol compound, so that the curing of the composition is not inhibited by atmospheric oxygen. Accordingly, the use of a low-molecular-weight acrylate monomer is unnecessary, thus permitting the use of an acrylate resin which is of low irritation to the skin. Such an acrylate resin which is of low to the skin is desirably one having a molecular weight of 100 or above, more desirably 300 or above, and most desirably 500 or above.

These polyene compounds described above may De used either alone or as a mixture of two or more of them.

In the actinic radiation-reactive pressure-sensitive adhesive composition of the present invention, the actinic radiation-curable resin is preferably contained in an amount of 1 to 500 parts by weight per 100 parts by weight of the pressure-sensitive adhesive organic compound used. Particularly, one comprising 10 to 200 parts by weight of the actinic radiation-curable resin and 100 parts by weight of the organic compound exhibits excellent characteristics.

In the actinic radiation-reactive pressure-sensitive adhesive composition of the present invention, a plurality of each of the pressure-sensitive adhesive organic compound and both of the polythiol compound and polyene compound constituting the actinic radiation-curable resin can be used in order to attain the characteristics desirable as an actinic radiation-reactive pressure-sensitive adhesive composition.

When the ratio of the curable resin to the organic compound is too low, the resulting composition will exhibit a low degree of reduction in the adhesive force upon irradiation with an actinic radiation such as ultraviolet rays and therefore the adhesive force cannot be lowered to 100 g/20 mm or below after irradiation, so that the pickup in the mounting step cannot be easily conducted, though the adhesive force (90° peel strength at a peel rate of 50 mm/min) thereof for a semiconductor wafer is sufficient before irradiation. On the contrary, when this ratio is too high, the adhesive force (90° peel strength at a peel rate of 50 mm/min) thereof for a semiconductor wafer will be insufficient, even before the irradiation with an actinic radiation such as ultraviolet rays, so that the wafer will be unfavorably shifted or peeled of in the dicing step.

The formulation of the actinic radiation-curable resin which is one of the components constituting the actinic radiation-reactive pressure-sensitive adhesive composition of the present invention will now be described.

The actinic radiation-curable resin comprises one or more polythiol compounds and one or more polyene compounds, each having at least two actinic radiation-reactive carbon-to-carbon double bonds in the molecule as the essential components.

The polythiol compound and the polyene compound are preferably used in such amounts that the equivalent ratio of the carbon-to-carbon double bond to the thiol group lies between 0.7:1.0 and 1.5:1.0. When this ratio is near 1.0:1.0, particularly desirable results can be obtained.

According to the present invention, the curing of the actinic radiation-curable resin can be conducted by irradiation with an actinic radiation, followed by, if necessary, heating. The actinic radiation includes visible rays, ultraviolet rays, electron beams, and X-rays.

When the actinic radiation-curable resin is to be cured with ultraviolet rays, an ultraviolet cure initiator is added to a mixture comprising the polythiol compound and the polyene compound as described above in order to induce the curing.

The ultraviolet cure initiator includes keto, azide, azo, diazo and peroxide compounds. Examples of the keto compound include diethoxyacetophenone, 2-hydroxymethyl-1-phenylpropan-1-one, 4'-isopropyl-1-hydroxy-2-methylpropiophenone, 2-hydroxy-2-methylpropiophenone, p-dimethylaminoacetophenone, p-t-butyldichloroacetophenone, p-t-butyltrichloroacetophenone, p-azidobenzalacetophenone, benzoin, benzoin methyl ether, benzoin ethyl ether, benzoin isopropyl ether, benzoin n-butyl ether, benzoin isobutyl ether, benzil, benzil dimethyl ketal, benzil-$\beta$-methoxyethyl acetal, 1-hydroxycylcohexyl phenyl ketone, benzophenone, methyl o-benzoylbenzoate, Michler's ketone, 4,4'-bisdiethylaminobenzophenone, 4,4'-dichlorobenzophenone, thioxanthone, 2-methylthioxanthone, 2-ethylthioxanthone, 2-chlorothioxanthone, and 2-isopropylthioxanthone. The azide compound includes 4,4'-diazidostilbene and p-phenylenebisazide. The azo compound includes 2,2'-azobisisobutyronitrile and 2,2'- azobisdimethylvaleronitrile. The diazo compound includes diazoaminobenzene. The peroxide compound includes di-t-butyl peroxide.

Although the amount of the ultraviolet cure initiator to be added may be suitably selected depending upon the kind thereof, it is preferably 0.1 to 20 parts by weight per 100 parts by weight of the mixture comprising the polythiol compound and the polyene compound. When the amount of the ultraviolet cure initiator is less than 0.1 part by weight per 100 parts by weight of the mixture, the resulting actinic radiation-reactive pressure-sensitive adhesive composition will be poor in reactivity upon irradiation with ultraviolet rays to give a low degree of reduction in the adhesive force and therefore, the adhesive force cannot be lowered to 100 g/20 mm or below, so that the pickup in the mounting step will not be facilitated, though the adhesive force (90° peel strength at a peel rate of 50 mm/min) thereof for a semiconductor wafer will be sufficient before the irradiation. On the contrary, when this amount exceeds 20 parts by weight, the adhesive force (90° peel strength at a peel rate of 50 mm/min) of the resulting adhesive composition for a semiconductor wafer will be insufficient even before the irradiation with an actinic radiation such as ultraviolet rays, so that the wafer will be shifted or peeled of in the dicing step. Further, the ultraviolet cure initiator will unfavorably remain on the chips prepared by dicing the wafer even after the pickup.

These ultraviolet cure initiators may be used alone or as a mixture two or more of them depending upon the required performance.

If necessary, the actinic radiation-reactive pressure-sensitive adhesive composition of the present invention may contain a crosslinking agent for the adhesive organic compound.

The crosslinking agent is preferably a compound which is reactive with the functional group contained in the adhesive organic compound, such as a hydroxyl or carboxyl group, and examples thereof include melamine compound, isocyanate compound, acid anhydride, amine compound, epoxy resin, and phenolic resin.

The crosslinking agent is a compound which is reactive with the functional group contained in the adhesive organic compound, such as a hydroxy or carboxyl group, and serves to control the adhesive force of the composition of the present invention. That is, the actinic radiation-reactive pressure-sensitive adhesive composition of the present invention is improved in adhesive force by incorporating a crosslinking agent thereinto, though the composition exhibits an acceptable adhesive force even if it contains no crosslinking agent.

The amount of the crosslinking agent is preferably 20 parts by weight or below per 100 parts by weight of the organic compound. The actinic radiation-reactive pressure-sensitive adhesive composition of the present invention has an acceptable adhesive force even when it does not contain any crosslinking agent and the adhesive force can be further improved by incorporating a crosslinking agent into the composition. However, the use of a crosslinking agent in an amount exceeding 20 parts by weight per 100 parts by weight of the organic compound is unfavorable, because part of the crosslinking agent remains without being consumed during the crosslinking of the organic compound to lower the adhesive force thereof.

The crosslinking agent may be used alone or as a mixture of two or more of them depending upon the required performance.

If necessary, the pressure-sensitive adhesive composition of the present invention may contain a tackifier.

Preferred examples of the tackifier include ester gum, polyterpene resin, terpene-phenol resin, polyolefin resin, polystyrene resin, cyclopentadiene resin, aromatic petroleum resin, cumarone-indenestyrene resin, cumarone-indene resin, xylene resin, modified phenolic resin, alkylphenolic resin, alkylphenol-acetytene resin, dammar, rosin, rosin derivative and DCPD petroleum resin.

Although the pressure-sensitive adhesive composition of the present invention exhibits an acceptable adhesive force, even when it does not contain any tackifier, the adhesive force can be further improved by incorporating a tackifier into the composition.

The amount of the tackifier is preferably 200 parts by weight or below per 100 parts by weight of the organic compound. The pressure-sensitive adhesive composition of the present invention has an acceptable adhesive force even when it does not contain any tackifier and the adhesive force can be further improved by incorporating a tackifier into the composition. However, the use of a tackifier in an amount exceeding 200 parts by weight per 100 parts by weight of the organic compound unfavorably brings about a lowering in its adhesive force.

The tackifier may be used alone or as a mixture of two or more of them depending upon the required performance.

Thermosettability can be imparted to the actinic radiation-reactive pressure-sensitive adhesive composition of the present invention by the addition of a free radical generator. The free radical generator includes peroxides, azo compounds and combinations of peroxides and decomposition accelerators.

Examples of the peroxide include ketone peroxides such as methyl ethyl ketone peroxide and cyclohexanone peroxide; diacyl peroxides such as benzoyl peroxide and lauroyl peroxide; hydroperoxides such as t-sutyl hydroperoxide and cumene hydroperoxide; dialkyl peroxides such as di-t-butyl peroxide and dicumyl peroxide; alkyl peresters such as t-butyl perbenzoate; and inorganic peroxides such as lead peroxide and manganese peroxide. Examples of the azo compound include 2,2'-azobisisobutyronitrile, 2,2'-azobisdimethylvaleronitrile and 2,2'-azobis(2,3,3-trimethylbutyronitrile). Further, a peroxide may be used together with a salt of a heavy metal such as cobalt, manganese, iron or copper or a tertiary amine such as dimethylaniline or dimethyl-p-toluidine as a decomposition accelerator.

Although the amount of the free radical generator may be suitably selected depending upon the kind thereof, it is preferably 50 parts by weight or below, still preferably 30 parts by weight or below per 100 parts by weight of the mixture of the polythiol compound with the polyene compound. The addition of the free radical generator in an amount exceeding 50 parts by weight per 100 parts by weight of the mixture unfavorably brings about an adverse effect such as retardation of curing.

The free radical generator may be used alone or as a mixture of two or more of them depending upon the required performance.

The pressure-sensitive adhesive composition of the present invention can be improved in the curing rate by incorporating an accelerator into the composition. Amine compounds are preferably used as such an accelerator and examples thereof include monoethanolamine, diethanolamine, triethanolamine, 4,4'-bisdiethylaminobenzophenone, ethyl 4-dimethylaminobenzoate, isopentyl 4-dimethylaminobenzoate and 2-dimethylaminoethyl benzoate; high-molecular-weight amine compounds prepared from epoxy resins and amine compounds; and derivatives of the above amine compounds, such as triethanolamine triacrylate.

Although the amount of the accelerator may be suitably selected depending upon the kind thereon, it is preferably 50 parts by weight or below, still preferably 30 parts by weight or below per 100 parts by weight of the mixture of the polythiol compound with the polyene compound. The addition of the accelerator in an amount exceeding 50 parts by weight per 100 parts by weight of the mixture unfavorably brings about an adverse effect such as retardation of curing.

The accelerator may be used alone or as a mixture of two or more of them depending upon the required performance.

The pressure-sensitive adhesive composition of the present invention may further contain a stabilizer to thereby lengthen the pot life.

Examples of the stabilizer include quaternary ammonium chloride such as benzyltrimethylammonium chloride, diethylhydroxylamine, cyclic amine, nitrile compound, substituted urea, benzothiazole, 4-amino-2,2,6,6-tetramethylpiperidine, bis(1,2,2,6,6-pentamethyl-4-piperidinyl) sebacate; organic acids such as lactic, oxalic, citric, tartaric and benzoic acids; hydroquinone and alkyl ethers thereof; t-butylpyrocatechol, phosphorus acid compounds such as tridecyl phosphite; organic phosphine, phosphorous acid salts; copper compounds such as copper naphthenate and an adduct of trichloroethyl phosphite with cuprous chloride; and caprylates of iron or manganese, naphthenates and sulfoxides.

Although the pressure-sensitive adhesive composition of the present invention exhibits a pot life of 6 months or longer in a dark place at 20° C. even if it does not contain any stabilizer, and is practically problem-free in this respect, the pot life thereof can be lengthened to 12 months or longer by the addition of the stabilizer. The amount of the stabilizer used is preferably 50 parts by weight or below, still preferably 30 parts by weight or below, per 100 parts by weight of the mixture of the potythiol compound with the polyene compound, though it may be suitably selected depending upon the kind thereof. The use of the stabilizer in an amount exceeding 50 parts by weight per 100 parts by weight of the mixture remarkably lowers the curing rate unfavorably.

The stabilizer may be used alone or as a mixture of two or more of them depending upon the required performance.

Further, the pressure-sensitive adhesive composition of the present invention may contain an ultraviolet absorber to thereby lengthen its pot life under fluorescent lighting.

Examples of the ultraviolet absorber include benzophenones such as 2-hydroxybenzophenone, 2,4-dihydroxybenzophenone, 2-hydroxy-4-methoxybenzophenone, 2,2',4-trihydroxybenzophenone, 2,2'-dihydroxy-4-methoxybenzophenone and 2,2',4,4'-tetrahydroxybenzophenone; salicylates such as phenyl salicylate and 2,4-di-t-butytphenyl 3,5-di-t-butyl-4-hydroxybenzoate; benzotriazoles such as (2'-hydroxyphenyl)benzotriazole, (2'-hydroxy-5'-methylphenyl)benzotriazole, (2'-hydroxy-3'-t-butyl-5'-methylphenyl)-5-chlorobenzotriazole; acrylonitriie compounds such as ethyl 2-cyano-3,3-diphenylacrylate and methyl 2-carbomethoxy-3-(p-methoxy)acrylate; metal complexes such as nickel. [2,2'-thiobis(4-t-octyl)phenolate] n-butylamine, nickel dibutyldithiocarbamate and cobalt dicyctohexyl dithiophosphate; and hindered amines such as bis(2,2,6,6-tetramethylpiperidinyl-4) sebacate.

Although the pressure-sensitive adhesive composition of the present invention exhibits a pot life of 2 weeks or longer at 20° C. under fluorescent lighting, even when it does not contain any ultraviolet absorber, and thus is practically in this respect, the pot life thereof can be lengthened to one month or longer by the addition of an ultraviolet absorber. The amount of the ultraviolet absorber to be added is preferably 50 parts by weight or below, still preferably 30 parts by weight or below per 100 parts by weight of the mixture of the polythiol compound with the polyene compound, though it may be suitably selected depending upon the kind thereof. The use of the ultraviolet absorber in an amount exceeding 50 parts by weight per 100 parts by weight of the mixture remarkably lowers the curing rate unfavorably.

The ultraviolet absorber may be used alone or as a mixture of two or more of them depending upon the required performance.

If necessary, the pressure-sensitive adhesive composition of the present invention may contain a filler.

Preferred examples of the filler include zinc oxide, titanium oxide, silica, aluminum hydroxide, calcium carbonate, barium sulfate, clay, and talc.

Although the pressure-sensitive adhesive composition of the present invention exhibits an acceptable adhesive force even if it does not contain any filler, the adhesive force thereof can be further improved by the addition of the filler.

The amount of the filler to be used is preferably 200 parts by weight or below per 100 parts by weight of the pressure-sensitive adhesive organic compound. The pressure-sensitive adhesive composition of the present invention exhibits an acceptable adhesive force even when it does not contain any filler, and the adhesive force thereof can be further improved by the addition of the filler. However, the use of the filler in an amount exceeding 200 parts by weight per 100 parts by weight of-the organic compound lowers the adhesive force unfavorably.

The filler may be used alone or as a mixture of two or more of them depending upon the required performance.

The pressure-sensitive adhesive composition of the present invention may contain, if necessary, other additives so far as the effect of the present invention is not damaged. Examples of the additives include coloring agents such as pigments and dyes, anti-foaming agents, leveling agents, thickeners, flame retardants, plasticizers, and solvents.

The practical application of the pressure-sensitive adhesive composition of the present invention is conducted as follows: First, the composition is uniformly applied to an optically transmissive film having a thickness of 5 to 200 $\mu$m and made from a plastic such as polyvinyl chloride, polyethylene terephthalate, polyethylene, polypropylene or crosslinked polyolefin in a thickness of 1 to 50 $\mu$m to prepare a pressure-sensitive adhesive sheet exhibiting an adhesive force (90° peel strength at a peel rate of 50 mm/min) of 200 to 1000 g/20 mm for a semiconductor wafer. In this step, the adhesive force may be regulated by heating if necessary. Then, a semiconductor wafer is diced into chips while being fixed on this sheet. The dicing may be conducted by any known process such as diamond scribing, laser scribing or blade dicing. Thereafter, the thus treated sheet is irradiated with an actinic radiation from the plastic film side to cure the adhesive composition. After the adhesive force has been lowered thereby to 100 g/20 mm or below, the chips are picked up and mounted on a base. The actinic radiation includes ultraviolet rays, electron seams, X-rays, radioactive radiation, and radiofrequency radiation. Among these actinic radiations, ultraviolet rays and electron beams are preferable. The source of the ultraviolet rays includes mercury vapor lamp, xenon lamp, sodium lamp, alkali metal lamp and ultraviolet laser, while the electron beams can be generated with an accelerator. The irradiation time varies depending upon the kind and output powder of the actinic radiation and formulation of the actinic radiation-reactive pressure-sensitive adhesive composition. For example, when a high-pressure mercury vapor lamp of 80 W/cm is used at a distance of 20 cm, the adhesive force can be lowered to 100 g/20 mm or below by the irradiation for 0.5 to 20 seconds. The mounting may be conducted by any known process such as eutectic alloy jointing, wax jointing or resin jointing.

The actinic radiation-reactive pressure-sensitive adhesive composition of the present invention is characterized in that the actinic radiation-curable resin contained therein is constituted of one or more polythiol compounds and one or more polyene compounds each having at least two actinic radiation-reactive carbon-to-carbon double bonds in the molecule, so that it exhibits a high reactivity upon irradiation with an actinic radiation and that the curing of the composition is not hindered by oxygen to give an extremely high curing rate in the air.

Up to this time, various acrylate resins such as polyester acrylate, urethane acrylate, epoxy acrylate and polyether acrylate resins have been used as the actinic radiation-curable resin for the actinic radiation-reactive pressure-sensitive adhesive composition in the dicing of a semiconductor wafer. However, when the dicing is conducted in the air by using such an acrylate resin a process which comprises conducting the irradiation with a high-output actinic radiation exposure system for a prolonged time or a process which comprises conducting the dicing in an inert gas such as nitrogen or a vacuum must be employed, because the curing of the resin is significantly inhibited by oxygen. Further, these processes have disadvantages in that the dicing takes a prolonged time and that enlarged and complicated equipment is necessary.

As described above, the actinic radiation-reactive pressure-sensitive adhesive composition of the present invention is characterized in that the actinic radiation-curable resin contained therein is constituted of one or more polythiol compounds and one or more polyene compounds each having at least two actinic radiation-reactive carbon-to-carbon double bonds in the molecule. Therefore, the composition exhibits a high reactivity upon irradiation with an actinic radiation and the curing of the composition is not inhibited by oxygen, thus giving an extremely high curing rate in the air. Accordingly, the composition has advantages in that the adhesiveness of the composition can be lost or lowered by irradiation for a shortened time and that the dicing can be conducted with simple and small equipment, because it can be conducted in air.

Further, according to the present invention, an actinic radiation-reactive pressure-sensitive adhesive composition which is free from the problem of inhibition of curing by oxygen can be obtained without using any functional monomer or diluent which is irritating to the skin and very smelly, though the acrylate resins of the prior art have a problem in that the use of such a monomer or diluent for improving the reactivity of the resin in air brings about irritation to the skin and odor. Thus, the composition of the present invention is very safe in respect of handleability.

EXAMPLES

Representative embodiments of the present invention will now be described in more detail by referring to the following Examples, though the present invention is not limited by them. In the Examples and Comparative Examples, all formulations are given by part by weight.

Examples 1 To 11

The formulations of the actinic radiation-reactive pressure-sensitive adhesive compositions of Examples 1 to 11 and the results of the examination thereof for adhesive force are given in Table 1. Detailed descriptions of the pressure-sensitive adhesive organic compound and the components of the actinic radiation-curable resin are given in Table 2. Since no adducts of allyl alcohol with epoxy compounds were commercially available, those prepared in a laboratory were used (Polyenes 1 to 4). The preparation procedures thereof will be described in the item "Synthesis of polyene compounds". The other components were all commercially available ones. The equivalent ratio of the actinic radiation-reactive carbon-to-carbon double bond contained in the polyene compound to the thiol group contained in the polythiol compound was always 1.0:1.0.

The adhesive force was determined by the following procedure: Each of the actinic radiation-reactive pressure-sensitive adhesive compositions of Examples 1 to 11 was uniformly applied on a polyvinyl chloride sheet having a thickness of 100 μm in a coating thickness of 20 μm and heated at 40° C. for 30 hours to give a pressure-sensitive adhesive sheet. This sheet was cut into 20 mm wide pieces and stuck to a semiconductor wafer to determine its adhesive force before irradiation with an actinic radiation. The adhesive force was determined by measuring the peel strength at a peel angle of 90° and at a peel rate of 50 mm/min. Thereafter, the wafer-sheet laminate was irradiated with ultraviolet rays from the polyvinyl chloride sheet side in the air by the use of a high-pressure mercury vapor lamp of 80 W/cm placed at a distance of 20 cm from the laminate for 3 seconds (Examples 1 to 7 and 9 to 11) or 1.5 seconds Example 8) to determine the adhesive force in a similar manner to that described above.

TABLE 1

| Components | Ex. 1 | Ex. 2 | Ex. 3 | Ex. 4 | Ex. 5 | Ex. 6 | Ex. 7 | Ex. 8 | Ex. 9 | Ex. 10 | Ex. 11 |
|---|---|---|---|---|---|---|---|---|---|---|---|
| acrylic adhesive compound 1 | 100 | 100 | 100 | 100 | 100 | 100 | 100 | 100 | 100 | | |
| acrylic adhesive compound 2 | | | | | | | | | | 100 | |
| saturated polyester adhesive compound | | | | | | | | | | | 100 |
| Polyene 1 | 29.5 | | | | 12.6 | 27.6 | 29.5 | 29.5 | 29.5 | 59.0 | 59.0 |
| Polyene 2 | | 35.0 | | | | | | | | | |
| Polyene 3 | | | 39.2 | | | | | | | | |
| Polyene 4 | | | | 27.0 | | | | | | | |
| Polyene 5 | | | | | 12.6 | | | | | | |
| thiol 1 | 20.5 | 15.0 | 10.8 | 23.0 | 24.8 | | 20.5 | 20.5 | 20.5 | 41.0 | 41.0 |
| thiol 2 | | | | | | 22.4 | | | | | |
| ultraviolet cure initiator | 2.0 | 2.0 | 2.0 | 2.0 | 3.0 | 3.0 | 5.0 | 5.0 | 5.0 | 10.0 | 10.0 |
| crosslinking agent | | | | | | | 5.0 | | | | |
| accelerator | | | | | | | | 5.0 | | | |
| filler | | | | | | | | | 30.0 | | |
| adhesive force g/20 mm | | | | | | | | | | | |
| before irradiation | 500 | 600 | 550 | 400 | 350 | 650 | 800 | 500 | 800 | 500 | 450 |
| after irradiation | 50 | 60 | 50 | 30 | 60 | 60 | 50 | 30 | 60 | 50 | 70 |
| irradiation time (sec) | 3.0 | 3.0 | 3.0 | 3.0 | 3.0 | 3.0 | 3.0 | 1.5 | 3.0 | 3.0 | 3.0 |

TABLE 2

| Component | Description |
|---|---|
| acrylic adhesive compound 1 | butyl acrylate-acrylic acid copolymer |
| acrylic adhesive compound 2 | butyl acrylate-acrylonitrile acrylic acid copolymer |
| saturated polyester adhesive compound | terephthalic acid/sebacic acid/ethylene glycol copolymer |
| Polyene 1<br>Polyene 2<br>Polyene 3<br>Polyene 4 | derivatives of adducts of allyl alcohol with epoxy compounds (see the item of "Synthesis of polyene compounds") |
| Polyene 5 | triallyl isocyanurate |
| thiol 1 | pentaerythritol tetrakis-thioglycolate |
| thiol 2 | pentaerythritol tetrakis-$\beta$-mercaptopropionate |
| ultraviolet cure initiator | 2-hydroxymethyl-1-phenylpropan-1-one |
| crosslinking agent | tolylene diisocyanate |
| accelerator | isopentyl 4-dimethyl-aminobenzoate |
| filler | zinc oxide |

Synthesis of Polyene Compounds

Polyenes 1 to 4 were prepared by the procedure which will be described below. The raw materials used are listed in Table 3.

TABLE 3

| Polyene No. | Raw materials | Charge (g) | General formula |
|---|---|---|---|
| 1 | allyl alcohol | 58 | (2) |
|   | allyl glycidyl ether | 228 | |
|   | epichlorohydrin | 185 | |
|   | BF$_3$-ether complex (catalyst) | 0.5 | |
| 2 | dicyclohexylmethane 4,4'-diisocyanate | 131 | (3) |
|   | adduct of allyl alcohol with ethylene oxide | 120 | |
|   | dibutyltin dilaurate (catalyst) | 0.8 | |
| 3 | Polyene 1 | 47.1 | (4) |
|   | allyl alcohol | 10.5 | |
|   | phthalic anhydride | 11.8 | |
|   | benzene | 50 | |
|   | BF$_3$-ether complex (catalyst) | 0.5 | |
|   | p-toluenesulfonic acid (catalyst) | 0.4 | |
| 4 | methanol | 32 | (5) |
|   | allyl glycidyl ether | 285 | |
|   | BF$_3$-ether complex (catalyst) | 0.5 | |

Polyene 1

58 g (1 mol) of allyl alcohol and 0.5 g of BF$_3$-ether complex were fed into a nitrogen-purged 500-cc four-necked flask (fitted with a condenser and a dropping funnel). 228 g (2 mol) of allyl glycidyl ether was dropped into the flask over a period of 3 hours, while keeping the contents at 60° to 70° C. Further, 185 g (2 mol) of epichlorohydrin was dropped into the flask at that temperature. This dropping took 2.5 hours. After the completion of the dropping, the contents were stirred for one hour, while keeping them at 70° C., to conduct a reaction. After the completion of the reaction, the reaction mixture was deaerated in a vacuum of 3 mmHg at 70° C. for one hour. Nearly no low-boiling matter was recovered. The obtained product was a colorless transparent liquid having a viscosity (25° C.) of 50 cP or below.

Polyene 2

131 g (0.5 mol) of dicyclohexylmethane 4,4'-diisocyanate (Hylene W, a product of Du Pont) was placed in a flask in a nitrogen atmosphere, followed by the addition of 0.8 g dibutyltin dilaurate. The contents were heated to 45° C. 120 g (1.0 mol) of an adduct of allyl alcohol with ethylene oxide (Allyl glycol, a product of Nippon Nyukazai Co., Ltd.) was dropped into the flask through a dropping funnel in such a way as to keep the contents at 80° to 90° C. After the completion of the dropping, the mixture was kept at 80° to 90° C. for 2 hours to conduct a reaction. The IR spectrum of the obtained product revealed the complete disappearance of the isocyanate group, which means the formation of urethane linkage.

Polyene 3

47.1 g (0.1 mol) of Polyene 1, 11.8 g (0.08 mol) of phthalic anhydride, 50 g of benzene and 0.4 g of p-toluenesulfonic acid were placed in a 200-cc four-necked flask and reacted under the reflux of the benzene for 2 hours, followed by the addition of 10.5 g (0.18 mol) of allyl alcohol. The obtained mixture was subjected to azeotropic dehydration. After the completion of the dehydration, the resulting mixture was neutralized with a 10% aqueous solution of NaHCO$_3$. The obtained organic layer was freed from the solvent and deaerated in a vacuum of 2 mmHg at 90° C. for one hour.

Polyene 4

32.0 g (1 mol) of methanol and 0.5 g of BF$_3$-ether complex were fed into a 500-cc four-necked flask fitted with a condenser. 285 g (2.5 mol) of allyl glycidyl ether was dropped into the flask over a period of 4 hours, while keeping the mixture at 50° to 60° C. by stirring. After the completion of the dropping, the mixture was further stirred for one hour at 60° C. to complete the reaction. The reaction mixture was gas chromatographed to detect either unreacted methanol nor unreacted allyl glycidyl ether.

As apparent from the results given in Table 1, the adhesive force before the irradiation with an antinic radiation of the pressure-sensitive adhesive sheets prepared by using the actinic radiation-reactive pressure-sensitive adhesive compositions of Examples 1 to 11 all fell in the range of 200 to 1000 g/20 mm, while the adhesive forces were all lowered to 100 g/mm or below by the irradiation with ultraviolet rays. Thus, the pressure-sensitive adhesive sheets have performances enabling them to be used in the dicing of a semiconductor wafer.

In Example 7, a crosslinking agent was used so that the adhesive force before the irradiation was enhanced. In Example 8, an accelerator was used so that the curing rate was enhanced to shorten the irradiation time to 1.5 seconds. In Example 9, a filler was used so that the adhesive force before the irradiation was enhanced.

Further, a semiconductor wafer having a diameter of 5 inch was stuck to a pressure-sensitive adhesive sheet prepared by using each of the adhesive compositions of Examples 1 to 11 and diced into chips 50 mm square with a rotary circular blade. In a case wherein any of the compositions of Examples 1 to 11 was used, the dicing could be accurately conducted without causing the shift or peeling of the wafer. After the irradiation with ultraviolet rays had been conducted under the same conditions as those of the above test on adhesive force, the chips were easily picked up by sticking up with a needle in all of the Examples 1 to 11.

Comparative Examples 1 To 4

The formulations of the actinic radiation-reactive pressure-sensitive adhesive compositions of Comparative Examples 1 to 4 and the results of the examination thereof for adhesive force are given in Table 4. The pressure-sensitive adhesive organic compounds and ultraviolet cure initiator used are the same as those used in Examples 1 to 11, while a polyester acrylate or a urethane acrylate was used as the actinic radiation-curable resin.

The obtained pressure-sensitive adhesive sheets were examined in a similar manner to that of Examples 1 to 11. The adhesive forces of the sheets before the irradiation all fell in the range of 200 to 1000 g/20 mm. However, the adhesive force could not be lowered to 100 g/20 mm or below by the irradiation with ultraviolet rays, though the irradiation time was 10 seconds, which was longer than that of the foregoing Examples, because the curing was inhibited by atmospheric oxygen to result in insufficient progress thereof. In Comparative Example 2, particularly, the adhesive force was not lowered at all.

In a similar manner to that of Examples 1 to 11, a semiconductor wafer having a diameter of 5 inch was stuck to a pressure-sensitive adhesive sheet prepared by using each of the compositions of Comparative Examples 1 to 4 and diced into chips 50 mm square with a rotary circular blade. In a case wherein any of the compositions of Comparative Examples 1 to 4 was used, the dicing could be accuracy conducted without causing the shift or peeling of the wafer. After the irradiation with ultraviolet rays had been conducted in a similar manner to that of Examples 1 to 11 for 10 seconds, the chips were picked up. In a case wherein any of the compositions of Comparative Examples 1 to 4 was used, the pickup could not be easily conducted. Further, the chip picked-up had the adhesive composition adhered thereto. Thus, the pressure-sensitive adhesive sheets of Comparative Examples 1 to 4 do not satisfy the performance necessitated as the sheet to be used in the dicing of a semiconductor wafer.

TABLE 4

| Components | Comp. Ex. 1 | Comp. Ex. 2 | Comp Ex. 3 | Comp. Ex. 4 |
|---|---|---|---|---|
| acrylic adhesive compound 1*[1] | 100 | 100 | | |
| acrylic adhesive compound 2*[1] | | | 100 | |
| saturated polyester adhesive compound*[1] | | | | 100 |
| acrylate resin 1*[2] | 50 | | 100 | 100 |
| acrylate resin 2*[3] | | 50 | | |
| ultraviolet cure initiator*[1] | 5.0 | 5.0 | 5.0 | 5.0 |
| adhesive force g/20 mm | | | | |
| before irradiation | 550 | 500 | 600 | 450 |
| after irradiation | 400 | 500 | 300 | 300 |
| irradiation time (sec) | 10.0 | 10.0 | 10.0 | 10.0 | note)
*[1]the same as those used in Examples 1 to 11
*[2]dipentaerythritol hexaacrylate
*[3]urethane acrylate prepared from hexamethylene diisocyanate and 2-hydroxyethyl acrylate Examples 12 To 20

The formulations of the actinic radiation-reactive pressure-sensitive adhesive compositions of Examples 12 to 20 and the results of the examination thereof for adhesive force are given in Table 5. The pressure-sensitive adhesive organic compound used ant the constituents of the actinic radiation-curable resin used are given in Table 6 in detail. The components used are all commercially available ones. The equivalent ratio of the actinic radiation-reactive carbon-to-carbon double bond contained in the polyene compound to the thiol group contained in the polythiol compound was always 1.0:1.0.

The examination was conducted by the same procedure as that of Examples 1 to 11.

TABLE 5

| Components | Ex. 12 | Ex. 13 | Ex. 14 | Ex. 15 | Ex. 16 | Ex. 17 | Ex. 18 | Ex. 19 | Ex. 20 |
|---|---|---|---|---|---|---|---|---|---|
| acrylic adhesive compound 1 | 100 | 100 | 100 | 100 | 100 | 100 | 100 | | |
| acrylic adhesive compound 2 | | | | | | | | 100 | |
| saturated polyester adhesive compound | | | | | | | | | 100 |
| Polyene 6 | 22.8 | | 11.1 | 21.3 | 22.8 | 22.8 | 22.8 | 45.6 | 45.6 |
| Polyene 7 | | 28.8 | | | | | | | |
| Polyene 8 | | | 11.1 | | | | | | |
| thiol 3 | 27.2 | 21.2 | 27.8 | | 27.2 | 27.2 | 27.2 | 54.4 | 54.4 |
| thiol 4 | | | | 28.7 | | | | | |
| ultraviolet cure initiator | 2.0 | 2.0 | 3.0 | 3.0 | 5.0 | 5.0 | 5.0 | 10.0 | 10.0 |
| crosslinking agent | | | | | 5.0 | | | | |
| accelerator | | | | | | 5.0 | | | |
| filler | | | | | | | 30.0 | | |
| adhesive force g/ 20 mm | | | | | | | | | |
| before irradiation | 700 | 500 | 350 | 650 | 800 | 500 | 800 | 500 | 450 |
| after irradiation | 60 | 50 | 60 | 60 | 50 | 30 | 60 | 50 | 70 |
| irradiation time (sec) | 3.0 | 3.0 | 3.0 | 3.0 | 3.0 | 1.5 | 3.0 | 3.0 | 3.0 |

TABLE 6

| Component | Description |
|---|---|
| acrylic adhesive compound 1 | butyl acrylate-acrylic acid copolymer |
| acrylic adhesive compound 2 | butyl acrylate acrylonitrile-acrylic acid copolymer |
| saturated polyester adhesive compound | terephthalic acid/sebacic acid/ethylene glycol copolymer |
| Polyene 6 | dipentaerythritol hexaacrylate |
| Polyene 7 | urethane acrylate prepared from hexamethylene diisocyanate and 2-hydroxyethyl acrylate |
| Polyene 8 | triallyl isocyanurate |
| thiol 3 | pentaerythritol tetrakisthioglycolate |
| thiol 4 | pentaerythritol tetrakis-β-mercaptopropionate |
| ultraviolet cure initiator | 2-hydroxymethyl-1-phenyl-propan-1-one |
| crosslinking agent | tolylene diisocyanate |
| accelerator | isopentyl 4-dimethyl-aminobenzoate |
| filler | zinc oxide |

As apparent from the results given in Table 5, the adhesive forces before the irradiation with an antinic radiation of the pressure-sensitive adhesive sheets prepared by using the actinic radiation-reactive pressure-sensitive adhesive compositions of Examples 12 to 20 all fell in the range of 200 to 1000 g/20 mm while the adhesive forces were all lowered to 100 g/mm or below by the irradiation with ultraviolet rays. Thus, the pressure-sensitive adhesive sheets have performances enabling them to be used in the dicing of a semiconductor wafer.

In Example 16, a crosslinking agent was used so that the adhesive force before irradiation was enhanced. In Example 17, an accelerator was used so that the curing rate was enhanced to shorten the irradiation time to 1.5 seconds. In Example 18, a filler was used so that the adhesive force before irradiation was enhanced.

Further, a semiconductor wafer having a diameter of 5 inch was stuck to a pressure-sensitive adhesive sheet prepared by using each of the adhesive compositions of Examples 12 to 20 and diced into chips 50 mm square with a rotary circular blade. In a case wherein any of the compositions of Examples 12 to 20 was used, the dicing could be accurately conducted without causing the shift or peeling of the wafer. After the irradiation with ultraviolet rays had been conducted under the same conditions as those of the above test on adhesive force, the chips were easily picked up by a needle in all of the Examples 12 to 20.

We claim:

1. An actinic radiation-reactive pressure-sensitive adhesive composition having as essential components:
    a pressure-sensitive adhesive compound comprising an acrylate copolymer, which is optionally mixed with a cross linking agent, and
    an actinic radiation-curable resin comprising one or more polythiol compounds and one or more polyene compounds, said polyene compounds each having at least two actinic radiation-reactive carbon-to-carbon double bonds from an acrylate compound and the equivalent ratio of carbon-to-carbon double bonds to the thiol groups being between 0.7:1.0 and 1.5:1.0, said composition having a reduced adhesion strength after curing.

2. An actinic radiation-reactive pressure-sensitive adhesive composition as set forth in claim 1, wherein the actinic radiation-curable resin is contained in the adhesive composition in an amount of 1 to 500 parts by weight per 100 parts by weight of the pressure-sensitive adhesive compound.

3. An actinic radiation-reactive pressure-sensitive adhesive composition as set forth in claim 1, wherein the actinic radiation-curable resin is contained in the adhesive composition in an amount of 10 to 200 parts by weight per 100 parts by weight of the pressure-sensitive adhesive compound.

4. An actinic radiation-reactive pressure-sensitive composition as set forth in claim 1, having an adhesive force of from 200 to 1000 g/20 mm for a semiconductor wafer before curing and an adhesive force of 100 g/20 mm or lower after curing.

* * * * *